(12) United States Patent
Otabe

(10) Patent No.: US 7,276,175 B2
(45) Date of Patent: Oct. 2, 2007

(54) SEMICONDUCTOR DEVICE FABRICATION METHOD

(75) Inventor: Takuya Otabe, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 268 days.

(21) Appl. No.: 11/062,632

(22) Filed: Feb. 23, 2005

(65) Prior Publication Data
US 2005/0186334 A1  Aug. 25, 2005

(30) Foreign Application Priority Data
Feb. 25, 2004 (JP) ............... 2004-049909

(51) Int. Cl.
*B44C 1/22* (2006.01)

(52) U.S. Cl. ............... 216/87; 216/41; 216/51; 216/57; 216/83; 216/100; 216/101; 216/108; 438/704; 438/705; 438/745; 438/799

(58) Field of Classification Search ............ None
See application file for complete search history.

(56) References Cited

U.S. PATENT DOCUMENTS

| 6,746,910 B2 * | 6/2004 | Hsu et al. ............ 438/238 |
| 6,955,992 B2 * | 10/2005 | Zhang et al. ............ 438/734 |
| 2002/0139776 A1 * | 10/2002 | Tsuchiya et al. ............ 216/86 |

FOREIGN PATENT DOCUMENTS

| JP | 2003-68983 | 3/2003 |
| JP | 2003-68984 | 3/2003 |
| JP | 2003-197877 | 7/2003 |

* cited by examiner

*Primary Examiner*—Anita K Alanko
(74) *Attorney, Agent, or Firm*—Nixon & Vanderhye P.C.

(57) ABSTRACT

A semiconductor device fabrication method comprises (1) forming a patterned mask layer on an oxide layer of a Mn-containing perovskite type oxide; (2) heat-treating the oxide layer; and (3) patterning the oxide layer with an etching solution containing at least one of hydrochloric acid, sulfuric acid, and nitric acid after the heat treatment of the oxide layer.

14 Claims, 2 Drawing Sheets

(a)

(b)

ly, the Mn-based perovskite-type oxides have high solubility in common etching solutions of acidic solutions or organic solvents and therefore, patterning using such etching solutions is difficult and conventionally, chemical mechanical polishing methods have been employed.

SEMICONDUCTOR DEVICE FABRICATION METHOD

CROSS-REFERENCE TO RELATED APPLICATION

This application is related to Japanese application No.2004-049909 filed on Feb. 25, 2004 whose priority is claimed under 35 USC § 119, the disclosure of which is incorporated by reference in its entirety.

BACKGROUND OF THE INVENTION

1. Field of the Invention

The invention relates to a semiconductor device fabrication method, particularly to patterning of a Mn-based perovskite-type oxide.

2. Description of Related Art

Giant magnetoresistance effect means considerable change of the electric resistance when magnetic field is applied and has been found in a metal artificial lattice Fe/Cr. Successively, the giant magnetoresistance effect has been found also in artificial lattices of Co/Cu and many (Fe, Co, or Ni, or their alloys)/(a noble metal such as Cu, Ag or Au, Cr, or a transition metal such as Ru). Today, along with investigations on mechanism of the giant magnetoresistance effect, investigations on its application have enthusiastically been made. With respect to the application of the giant magnetoresistance effect, for the purpose of the soft magnetic giant magnetoresistance effect, investigations of giant magnetoresistance multilayer thin films utilizing retention difference and magnetic anisotropy have been advanced. Spin valve giant magnetoresistance expected to be highly possible for utilization to magnetoresistance heads for reading high density magnetic recording is a typical representative for that.

Conventionally, the giant magnetoresistance effect has been found in metal-based materials. However, materials having the giant magnetoresistance effect have been found among Mn-based perovskite-type oxide series.

In recent years, the electric resistance properties of the Mn-based perovskite-type oxide materials have been found to be changeable by applying one or more electric pulses to thin films or bulk materials. Accordingly, the Mn-containing oxides are expected to be applicable for nonvolatile memories (reference to Japanese Unexamined Patent Publication Nos. 2003-68983, 2003-68984, and 2003-197877).

For applications to nonvolatile memories, it is required to form fine devices and therefore, thin film formation techniques of Mn-based perovskite-type oxides are indispensable. As thin film formation methods there are physical methods such as a vacuum evaporation method, a sputtering method, a laser abrasion method and the like and chemical methods such as a sol-gel method and MOCVD (Metal Organic Chemical Vapor Deposition) for obtaining oxide ferroelectrics from organometal compounds as starting materials by thermally decomposing and oxidizing the materials and the like.

Chemical mechanical polishing methods (CMP methods) have generally been employed for patterning the Mn-based perovskite-type oxide materials.

Here, a semiconductor device fabrication method described in Japanese Unexamined Patent Publication No. 2003-197877 will be described with reference to FIG. 2. FIG. 2 is a cross-sectional view showing fabrication steps of a conventional semiconductor device.

At first, a patterned oxide film 53 is formed on an underlayer 51. Next, an oxide layer 55 of a Mn-based perovskite-type oxide is formed so as to cover the oxide film 53 to obtain the structure shown in FIG. 2(a). Next, the oxide layer 55 is abraded until the oxide film 53 is exposed by a chemical mechanical polishing method so as to obtain a patterned oxide layer 55 (FIG. 2(b)).

However, generally, the Mn-based perovskite-type oxides have high solubility in common etching solutions of acidic solutions or organic solvents and therefore, patterning using such etching solutions is difficult and conventionally, chemical mechanical polishing methods have been employed.

Accordingly, as described above, chemical mechanical polishing methods have been employed, however in the case of the methods, the process steps are many and complicated and as a result, the process cost is high. Further, in general, each process step inevitably generates defective products (every step has a certain failure ratio) and thus the yield is decreased more as more process steps are performed.

Therefore, as a simple and easy method, patterning of the Mn-based perovskite-type oxide materials is desirable to be carried out by wet etching using an etching solution.

In the case of using Mn-based perovskite-type oxides for memory devices, fine pattern formation by dry etching is inevitable in future. In such a case, a large quantity of etching residues are left at the time of etching the Mn-based perovskite-type oxides and these residues form leak paths to cause adverse effects on the memory yield. Accordingly, residue treatment using chemical solutions is required, and also in such a case, the Mn-based perovskite-type oxides are easily dissolved in the chemical solutions for the residue treatment to result in defective shape such as film separation and decreased yield.

SUMMARY OF THE INVENTION

In view of the above state of the art, the invention has been achieved and aims to provide a semiconductor device fabrication method involving patterning of an oxide layer of a Mn-containing perovskite type oxide in a simple manner and accordingly capable of lowering the production cost and improving the yield.

A semiconductor device fabrication method of the invention involves (1) forming a patterned mask layer on an oxide layer of a Mn-containing perovskite type oxide; (2) heat-treating the oxide layer; and (3) patterning the oxide layer with an etching solution containing at least one of hydrochloric acid, sulfuric acid, and nitric acid after the heat treatment of the oxide layer.

When the heat treatment of the oxide layer is carried out after the patterned mask layer is formed on the oxide layer of the Mn-containing perovskite type oxide, the solubility of the oxide layer in the proximity of the mask layer patterns is lowered. Under such a state, when the oxide layer is treated with an etching solution, the parts with high solubility (the parts other than the parts in the proximity of the mask layer patterns) are dissolved and the parts with low solubility (the parts in the proximity of the mask layer patterns) remain to pattern the oxide layer.

According to the method of the invention, the oxide layer can more easily be patterned than by a method of employing CMP method and therefore, a semiconductor device can easily and simply be fabricated by employing the method of the invention. Consequently, according to the invention, the production cost of the semiconductor device can be lowered.

Further, when the method of the invention is employed, the patterned mask layer is less easily separated at the time of etching, the production yield of the semiconductor device can be improved.

DESCRIPTION OF THE PREFERRED EMBODIMENTS

Figure 1:
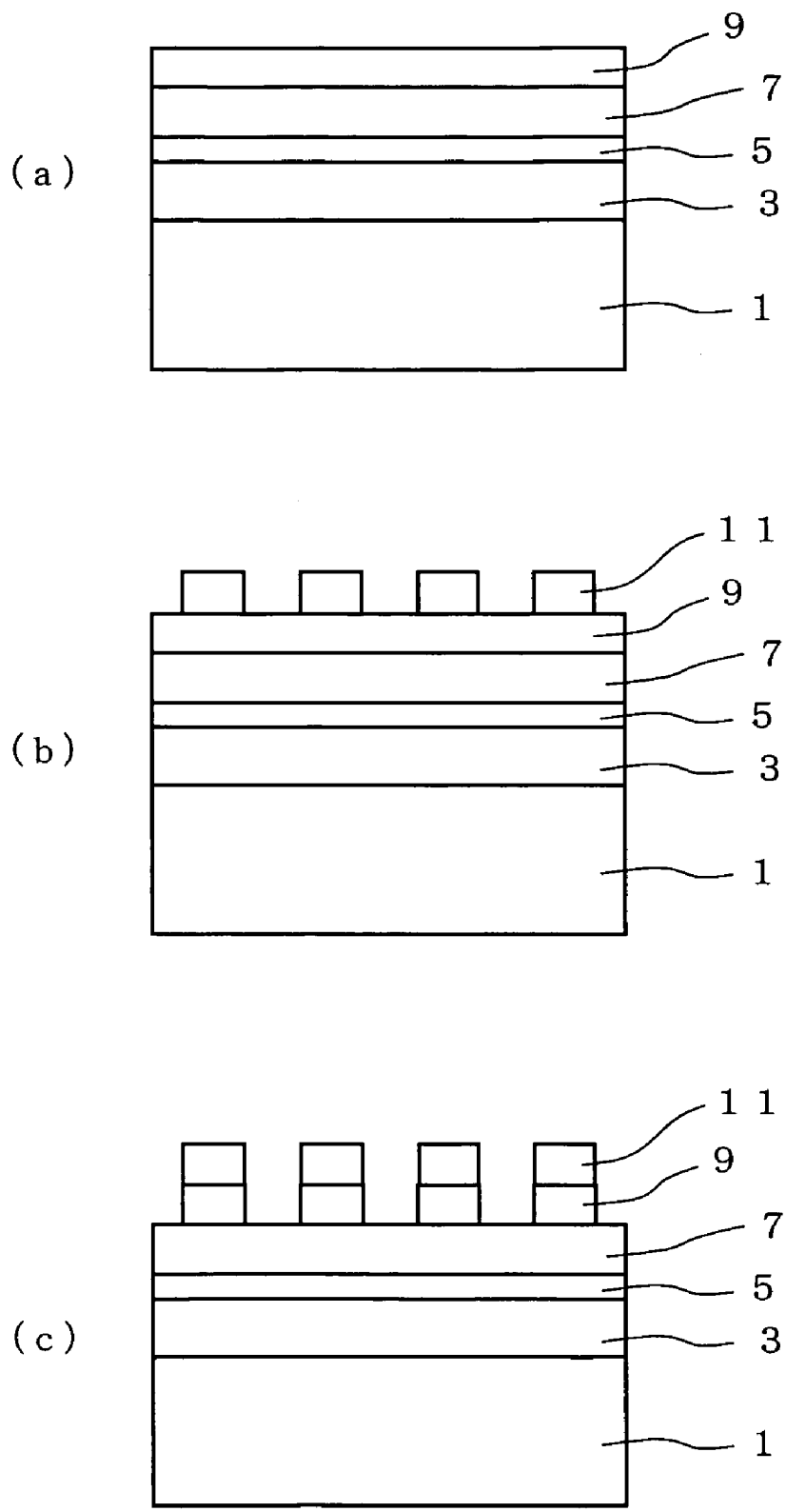
FIG. 1 is a cross-sectional view showing the semiconductor device fabrication process related to Examples 1 and 2 of the invention.
Figure 2:
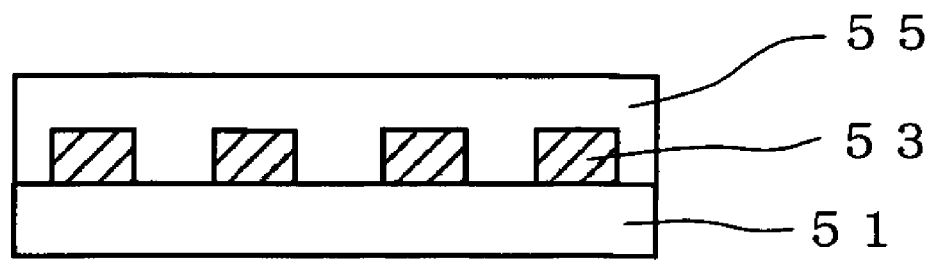
FIG. 2 is a cross-sectional view showing a conventional semiconductor device fabrication process.
Figure 2:
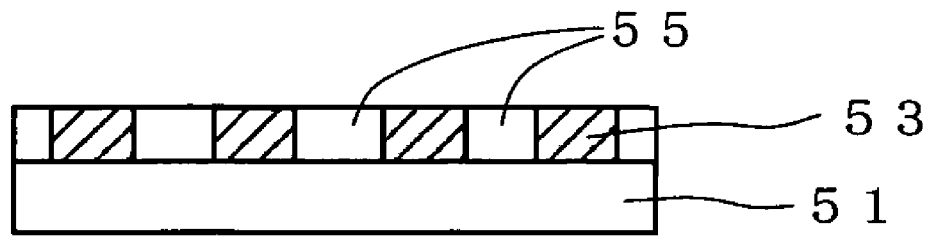

A semiconductor device fabrication method of the invention involves (1) forming a patterned mask layer on an oxide layer of a Mn-containing perovskite type oxide; (2) heat-treating the oxide layer; and (3) patterning the oxide layer with an etching solution containing at least one of hydrochloric acid, sulfuric acid, and nitric acid after the heat treatment of the oxide layer.

1. The Step of Forming a Patterned Mask Layer on an Oxide Layer of a Mn-Containing Perovskite Type Oxide 1-1. Oxide Layer of Mn-Containing Perovskite Type Oxide The oxide layer of a Mn-containing perovskite type oxide is generally formed on a substrate by a sputtering method, a vacuum evaporation method, a sol-gel method, a laser abrasion method, or a MOCVD method. The substrate may be a semiconductor substrate of silicon or the like, an insulating substrate of glass or the like, or a conductive substrate of a metal or the like.

The oxide layer is preferably formed on a substrate on which an under level electrode is previously formed. The oxide layer is preferably formed by (1) forming the under level electrode on the substrate and (2) forming the oxide layer of the Mn-containing perovskite type oxide on the obtained substrate. In this case, the under level electrode is formed between the oxide layer and the substrate. The under level electrode is one of electrodes of a semiconductor device such as a nonvolatile memory device. The under level electrode may be formed by a sputtering method or the like using a metal such as Pt. The under level electrode is also preferable to be formed through an insulating film such as a silicon oxide film. This is because the substrate and the semiconductor device to be formed thereon can electrically be isolated and the device properties can be improved. Further, the under level electrode may preferably be formed through a film, for example, $TiO_2$ film to heighten the adhesion strength between the insulating film and the under level electrode.

The under level electrode may be formed on the entire surface of the substrate. Alternatively, a plurality of under level electrodes may be formed on the substrate. A plurality of under level electrodes preferably have a long shape and are preferably arranged in stripes.

In this specification, the phrase "on the substrate" includes the state of being contact with the substrate, being contact with the substrate through a protection film, an insulating film or the like, or being above the substrate in non-contact manner. Other phrases "on the film" and "on the layer" also imply similarly as described.

The oxide layer is preferable to contain the Mn-containing perovskite type oxide defined by a general formula $AMnO_3$ (wherein A includes one or more metals selected from a group consisting of La, Pr, Ca, and Sr). It is because, in such a case, the crystallization effect by the heat treatment to be described later is caused significantly.

The thickness of the oxide layer is preferably 10 to 1,000 nm. The reason is that if it is thinner than 10 nm, dielectric breakdown of the oxide layer may possibly be caused at the time of electric pulse application and if it exceeds 1,000 nm, processing by dry etching becomes difficult.

1-2. Patterned Mask Layer

The patterned mask layer is formed on the oxide layer. The patterned mask layer is preferably a plurality of upper level electrodes. The upper level electrodes may be formed using a metal, particularly preferably using a material containing a noble metal element such as Pt or Ir. This is because the noble metal element-containing material generally has a low reactivity with an etching solution and high heat resistance. More practically, the upper level electrodes may be formed by forming Pt, Ir or $IrO_2$, or their alloys in a single layer or multi-layers. The upper level electrodes may be formed by a sputtering method or the like. The thickness of the upper level electrodes is preferably 10 to 5,000 nm. If it is thinner than 10 nm, the upper level electrodes are possibly broken and separated at the time of the electric pulse application and if it exceeds 5,000 nm, patterning by dry etching becomes difficult.

A plurality of the upper level electrodes preferably have a long shape and are preferably arranged in stripes. In the case a plurality of the under level electrodes are formed in stripes on the substrate, a plurality of the upper level electrodes are preferably arranged so as to cross the under level electrodes. This is because the respective crossing points can compose cross-point memories corresponding to 1 bit. Also, a plurality of the upper level electrodes may be arranged practically like a matrix. This is because the respective upper level electrodes arranged like a matrix correspond to 1 bit. It is preferable that the respective upper level electrodes may practically have a square-shape, preferably have an about 2 μm-square shape. The upper electrodes may be patterned, for example, by a dry etching method.

2. The Step of Heat Treatment of the Oxide Layer

When the oxide layer is heat-treated, the parts of the oxide layer in the proximity of the mask layer patterns are crystallized in higher priority. The crystallized parts (the proximal parts of the mask layer patterns) have decreased solubility. Accordingly, in the following step, it is made possible to pattern the oxide layer so as to leave the crystallized parts. Here, the word "solubility" means the solubility in a specified etching solution to be used in the following step.

The heat treatment of the oxide layer is preferable to be carried out at 200 to 900° C. If it is lower than 200° C., crystallization of the oxide layer is difficult to be caused and if it is higher than 900° C., stress may be applied to the mask layer owing to the thermal expansion of the oxide layer and the mask layer may be separated in some cases. The heat treatment is also preferable to be carried out for 30 seconds to 120 minutes. If it is shorter than 30 seconds, the crystallization may be insufficient and if it is longer than 120 minutes, stress may be applied to the mask layer and the mask layer may be separated in some cases. Further, the heat treatment may be carried out under an oxygen, nitrogen, hydrogen, or argon, or their gas mixture atmosphere. The heat treatment is preferably carried out under an atmosphere of an inert gas such as nitrogen or argon.

3. The Step of Patterning the Oxide Layer with an Etching Solution Containing at Least One of Hydrochloric Acid, Sulfuric Acid, and Nitric Acid After the Heat Treatment of the Oxide Layer It is preferable to use an etching solution containing at least one of hydrochloric acid, sulfuric acid, and nitric acid. In such a case, side etching of the oxide layer is suppressed to give patterns with good form. Specifically, the etching solution to be used may be hydrochloric acid, sulfuric acid, nitric acid, or their mixture, or a mixture of at least one of hydrochloric acid, sulfuric acid, and nitric acid with another inorganic acid or water. Sulfuric acid is particularly preferable to be used as the etching solution. In such a case, side etching of the oxide layer is suppressed more to give patterns with better form.

The concentration of the etching solution is preferably 0.0001 to 50 wt. %. If it is lower than 0.0001 wt. %, wet etching rate is extremely small and it takes a long time to carry out etching. If it exceeds 50 wt. %, the wet etching rate is extremely fast to make control difficult. The temperature of the etching solution is preferably 0 to 100° C. If it is lower than 0° C., the solution is frozen and if it is higher than 100° C., water of the etching solution is evaporated to make the concentration of the solution unstable. The etching duration is preferably 10 to 1,800 seconds. If it is shorter than 10 seconds, control is difficult and the shape becomes unstable and if it is longer than 1,800 seconds, water is diffused in the oxide film layer to cause insulation failure of the oxide film layer.

4. Dry Etching Step

Before the step of patterning the oxide layer, a step of dry etching the oxide layer may further be added. The step of dry etching the oxide layer may be carried out before or after the step of heat treatment of the oxide layer. Patterning of the oxide layer may be carried out by the dry etching and the residues generated at that time are removed by the etching solution, so that it is made possible to form fine patterns. Further, at the time of removing the residues with the etching solution, conventionally, the oxide layer is sometimes damaged, however in the invention, since the residues are removed with the etching solution after the heat treatment of the oxide layer, the damages on the oxide layer can be suppressed to low. The dry etching can be carried out using, for example, Ar or $BCl_3$ gas. More in detail, dry etching may be carried out under a condition of a ratio of Ar to $BC_3$ of 7:3.

EXAMPLE 1

1. Fabrication Process

FIG. 1 is a cross-sectional view showing the semiconductor device fabrication process according to Example 1. Hereinafter, the semiconductor device fabrication process according to this example will be described along with FIG. 1.

At first, a silicon oxide film 3 with a film thickness of 300 nm is formed on a silicon substrate 1 by thermal oxidation. Next, a $TiO_2$ adhesion layer 5 and a Pt under level electrode 7 are formed on the silicon oxide film 3 by a sputtering method.

Next, employing a sputtering method, a 100 nm-thick oxide layer 9 of a Mn-based perovskite type oxide is formed to obtain the structure shown in FIG. 1(a). In this example, as the oxide layer 9 is used $Pr_xCa_{1-x}MnO_3$ (hereinafter, referred to as PCMO) wherein x=0.7. The value of x is not necessarily limited to 0.7 and if it satisfies $0 \leq x \leq 1$, similar results as described below can be achieved.

Next, a Pt film is formed on the oxide layer 9 by a sputtering method and patterning is carried out by a dry etching method to form a plurality of upper level electrodes 11 and thus obtain the structure shown in FIG. 1(b). The respective upper level electrodes 11 have a 2 µm-square shape and are arranged like a matrix at 10 µm pitches. Additionally, the electrode material is not limited to Pt. Any material having low reactivity with an acid to be used for wet etching and high heat resistance may be used and for example, materials containing noble metal elements are preferable since they are highly durable to acids and heat. Particularly, in the case a Pt film, an Ir film, an $IrO_2$ film, a Pt—Ir alloy film, or a layered film of them is used for a memory device using a PCMO film, they are most preferable as electrode materials owing to the low reactivity with etching solutions and high heat resistance.

Next, heat treatment of the oxide layer 9 is carried out. In this example, the heat treatment is carried out at 500° C. for 30 minutes under a nitrogen atmosphere. In general, Mn-based perovskite-type oxide film has a feature that when the film is subjected to heat treatment after a mask layer formation, parts of the film where the mask layer exists are crystallized in higher priority. Therefore, the wet etching rate of the parts where the mask exists significantly differs from that of the parts where no mask exists and patterns of a good shape with little side etching can be obtained. In the invention, the heat treatment is carried out after formation of the upper level electrodes 11, so that the parts of the oxide layer 9 in the proximity of the upper level electrodes 11 are crystallized to lower the solubility.

The heat treatment temperature is not limited to 500° C. The heat treatment is effective at a temperature of 200° C. to 900° C. If it is 200° C. or lower, no crystallization is caused to result in ineffectiveness. If the heat treatment temperature is 900° C. or higher, considerably strong stress is applied between the oxide layer 9 and the upper level electrodes 11 owing to thermal expansion of the oxide layer 9 by heating to result in occurrence of separation of the upper level electrodes 11 and therefore, it is not proper.

The heat treatment atmosphere may be oxygen, nitrogen, hydrogen, argon, or a mixture of these gases to cause desirable effects and heat treatment under an atmosphere of an inert gas such as $N_2$, Ar, or the like is preferable.

Next, using the upper level electrodes 11 as a mask, the oxide layer 9 is patterned by wet etching with a variety of chemical solutions. The parts which are not masked are etched until the under level electrode is exposed.

The type of the etching solution, temperature, and etching duration to be used in this example are shown in Table 1.

TABLE 1

| etching solution | temperature (° C.) | etching duration (second) |
| --- | --- | --- |
| hydrochloric acid | 25 | 25 |
| sulfuric acid | 25 | 50 |
| nitric acid | 25 | 25 |
| phosphoric acid | 25 | 25 |
| acetic acid | 25 | 25 |
| hydrogen peroxide solution | 25 | 25 |
| hydrofluoric acid | 25 | — |
| buffered hydrofluoric acid | 25 | — |
| ammonia | 25 | 10 |
| various organic washing solutions | 110 | 2 to 5 |

All of the acid and alkaline solutions to be used had 1% concentration. For the organic washing solutions, OMR 502A manufactured by Tokyo Ohka Kogyo Co., Ltd. and EKC 265, EKC 270, EKC 787, and EKC 789 manufactured by EKC Technology Inc. are used.

In the case the above-mentioned chemical solution treatment is carried out without heat treatment, since the oxide layer 9 had a higher etching rate in the horizontal direction than the vertical direction, the upper level electrodes 11 are easily separated.

2. Patterning of the Oxide Layer by the Respective Etching Solutions

After the heat treatment of the oxide layer 9 was carried out, patterning of the oxide layer 9 was carried out using the respective etching solutions shown in Table 1.

In the case of using phosphoric acid, acetic acid, or hydrogen peroxide solution, etching in the horizontal direction (side etching) of the oxide layer 9 progressed fast to separate the upper level electrodes 11. Accordingly, it was found that phosphoric acid, acetic acid, and hydrogen peroxide solution were not preferable as the etching solution of the invention.

In the case of using hydrofluoric acid or buffered hydrofluoric acid, foreign substance precipitation in the side wall of the oxide layer 9 occurred. Accordingly, although the hydrofluoric acid and buffered hydrofluoric acid are anyhow usable as an etching solution in the invention, they are not particularly preferable.

In the case of using ammonia or the various organic washing solutions, side etching of the oxide layer 9 progressed fast to separate the upper level electrodes. Accordingly, ammonia and the various organic washing solutions are not preferable for the etching solution in the invention. Further, since the etching rate was high to make control difficult and from this point, they are not preferable for the etching solution in the invention.

In the case of using hydrochloric acid, sulfuric acid, or nitric acid, side etching of the oxide layer 9 was little and a good pattern shape was obtained.

In the case of using sulfuric acid among them, the etching rate of the side etching of the oxide layer 9 was particularly small. In this case, the pattern shape of the oxide layer 9 was made easily controllable and therefore, it is most preferable for a memory device.

The chemical solutions to be used here are effective if they contain at least one of hydrochloric acid, sulfuric acid, and nitric acid. The acidity of the etching solution may be adjusted by mixing at least one of hydrochloric acid, sulfuric acid, and nitric acid with another inorganic acid or $H_2O$. Further, the etching rate may be adjusted by heating or cooling the etching solution.

EXAMPLE 2

When the oxide layer of the Mn-based perovskite-type oxide is patterned by dry etching, the wet etching rate of the oxide layer is made significantly different from that of the etching residues by carrying out the same heat treatment to that in Example 1 and therefore the residue treatment using a chemical solution is made possible. To confirm that, semiconductor device fabrication was carried out by the following method. Hereinafter, the fabrication process will be described along with FIG. 1.

The structure as shown in FIG. 1(b) was obtained by carrying out steps to the heat treatment of the oxide layer 9 by the same method as Example 1.

Next, using the upper level electrodes 11 as mask, dry etching of the oxide layer 9 was carried out with Ar and $Cl_2$ gas to pattern the oxide layer 9 to obtain the structure shown in FIG. 1(c). The etching residues were produced on the side wall of the patterned oxide layer 9 at this time.

Etching residues were removed using hydrochloric acid, sulfuric acid, or nitric acid in the same conditions as those in Example 1.

As a result, it was found that the etching residues were soluble in any chemical solutions described above and that the etching rate of the residues was several ten times as high as that of the oxide layer 9. Therefore, without damaging the oxide layer 9 so much, the etching residues were removed. In Example 2, since the oxide layer 9 was etched by dry etching, finer patterns than those in Example 1 could be formed.

In Examples 1 and 2, although $Pr_xCa_{1-x}MnO_3$ (x=0 to 1) was used as the Mn-based perovskite-type oxide, the oxide may not be limited to this. Mn-containing perovskite type oxides, particularly any Mn-based perovskite type oxide defined by a general formula $AMnO_3$ (wherein A represents one or more metals selected from a group consisting of La, Pr, Ca, and Sr), has the same properties as those of PCMO and therefore, the same effects as described above can be achieved.

In the above-mentioned embodiments of the invention, a sputtering method is employed for the film formation method of the Mn-based perovskite-type oxide thin film, however the method may not be limited to that. For example, a vacuum evaporation method, a sol-gel method, a laser abrasion method, or a MOCVD method may be employed.

What is claimed is:

1. A semiconductor device fabrication method comprising (1) forming a patterned mask layer on an oxide layer of a Mn-containing perovskite type oxide; (2) heat-treating the oxide layer; and (3) patterning the oxide layer with an etching solution containing at least one of hydrochloric acid, sulfuric acid, and nitric acid after the heat treatment of the oxide layer to remove the portion of said heat treated oxide layer which was not masked during said heat treatment.

2. The semiconductor device fabrication method according to claim 1, wherein the oxide layer used in the step (1) is formed on a substrate bearing an under level electrode.

3. The semiconductor device fabrication method according to claim 1, wherein the Mn-containing perovskite type oxide is defined by the general formula $AMnO_3$ wherein A includes one or more metals selected from the group consisting of La, Pr, Ca, and Sr.

4. The semiconductor device fabrication method according to claim 1, wherein a plurality of upper level electrodes are utilized as the patterned mask layer.

5. The semiconductor device fabrication method according to claim 4, wherein the upper level electrodes are formed of a material containing a noble metal element.

6. The semiconductor device fabrication method according to claim 1, wherein the step (2) is carried out at 200 to 900° C.

7. The semiconductor device fabrication method according to claim 1, wherein the patterning in step (3) is first conducted by dry etching, and then by wet etching with the etching solution.

8. A semiconductor device fabrication method comprising (1) forming a patterned mask layer on an oxide layer of a Mn-containing perovskite type oxide; (2) heat-treating the oxide layer with the mask layer thereon; and (3) patterning the heat-treated oxide layer with the mask layer thereon, with an etching solution containing at least one of hydrochloric acid, sulfuric acid, and nitric acid after the heat treatment of the oxide layer.

9. The semiconductor device fabrication method according to claim 8, wherein the oxide layer used in the step (1) is formed on a substrate bearing an under level electrode.

10. The semiconductor device fabrication method according to claim 8, wherein the Mn-containing perovskite type oxide is defined by the general formula $AMnO_3$ wherein A includes one or more metals selected from the group consisting of La, Pr, Ca, and Sr.

11. The semiconductor device fabrication method according to claim 8, wherein a plurality of upper level electrodes are utilized as the patterned mask layer.

12. The semiconductor device fabrication method according to claim 11, wherein the upper level electrodes are formed of a material containing a noble metal element.

13. The semiconductor device fabrication method according to claim 8, wherein the step (2) is carried out at 200 to 900° C.

14. The semiconductor device fabrication method according to claim 8, wherein the patterning in step (3) is first conducted by dry etching, and then by wet etching with the etching solution.

* * * * *